(12) United States Patent
Roll et al.

(10) Patent No.: US 11,573,278 B2
(45) Date of Patent: Feb. 7, 2023

(54) MAGNETIC RESONANCE MEASURING ASSEMBLY

(71) Applicant: Neoscan Solutions GmbH, Magdeburg (DE)

(72) Inventors: Stefan Roll, Forchheim (DE); Robert Odenbach, Magdeburg (DE)

(73) Assignee: Neoscan Solutions GmbH, Magdeburg (DE)

( * ) Notice: Subject to any disclaimer, the term of this patent is extended or adjusted under 35 U.S.C. 154(b) by 0 days.

(21) Appl. No.: 17/104,127

(22) Filed: Nov. 25, 2020

(65) Prior Publication Data

US 2021/0199734 A1 Jul. 1, 2021

(30) Foreign Application Priority Data

Nov. 29, 2019 (DE) .......................... 102019132531.5
Nov. 23, 2020 (DE) .......................... 102020130916.3

(51) Int. Cl.
*G01R 33/28* (2006.01)

(52) U.S. Cl.
CPC .................................. *G01R 33/28* (2013.01)

(58) Field of Classification Search
USPC ............................................................ 324/9
See application file for complete search history.

(56) References Cited

U.S. PATENT DOCUMENTS

| 10,885,758 | B2* | 1/2021 | Johnson | G01S 17/93 |
| 2006/0255938 | A1* | 11/2006 | Van den Brink | A61B 50/20 340/568.1 |
| 2011/0273293 | A1* | 11/2011 | Itkin | G08B 13/184 340/557 |
| 2018/0052210 | A1* | 2/2018 | Piron | A61B 5/055 |
| 2019/0324098 | A1* | 10/2019 | McNulty | G01R 33/288 |

OTHER PUBLICATIONS

Google Translation of German Office Action for 10 2019 132 531.5, dated Oct. 12, 2020. (Year: 2020).*
Autor / Organic Chemistry University Siegen: Varian VNMR-S600. Date of publication: Aug. 16, 2018 Source (URL: https://www.chemie-biologie.unisiegen.de / oc / oc2 / nmr / 600mhz / index.html? lang = en) [researched on Jul. 10, 2020].

* cited by examiner

*Primary Examiner* — Rodney E Fuller
(74) *Attorney, Agent, or Firm* — Volpe Koenig

(57) ABSTRACT

An MR measuring assembly (3) with an MR device (2) is provided, which has a main magnet (4) generating a stray magnetic field and a platform (1), having a side border (5), on which the MR device (2) is placed. The border (5) marks an iso-contour surface of the stray field at a specified magnetic field strength. The platform (1) therefore forms a natural barrier that prevents people or objects being exposed to magnetic field strengths that are too high. To this end provision is additionally made, in accordance with the invention, for a step (15) for the marking of an iso-contour surface of a stray magnetic field of an MR device (2) at a specified magnetic field to be used.

20 Claims, 3 Drawing Sheets

MAGNETIC RESONANCE MEASURING ASSEMBLY

INCORPORATION BY REFERENCE

The following documents are incorporated herein by reference as if fully set forth: German Patent Application No. 10 2019 132 531.5, filed Nov. 29, 2019; and German Patent Application No. 10 2020 130 916.3, filed Nov. 23, 2020.

TECHNICAL FIELD

The invention relates to an MR (magnetic resonance) measuring assembly with an MR device, which has a main magnet that generates a stray magnetic field, and with a platform, having a border around its edge, on which the MR device is placed.

Such MR measuring arrangements are known from practical experience and are used for placing an MR device in position. Here the platform may help compensate for an uneven surface or assist with uniform distribution of the weight of the MR device on the ground. This is because the surface is frequently not suitable for directly placing MR devices—frequently weighing more than a metric ton—onto it.

The invention also relates to the use of a step in the manner described in more detail below.

The invention also relates to a method for determining a border of a platform for an MR device.

In addition, the invention relates to a platform that is manufactured using the method previously named.

In the context of this invention, the term "Magnetic resonance" is abbreviated to "MR".

The MR device may for example be an MR tomograph or an MR spectrometer.

BACKGROUND

Every MR device has a main magnet which generates a magnetic field in order, thereby, to align the nuclear spins of MR-active atoms such as the nuclear spins of hydrogen atoms. Generally, the main magnet consists of a current-carrying magnetic coil. As a rule this is made from superconductive material and therefore, as a rule, is massively cooled.

During the generation of the magnetic field by the main magnet, an unwanted stray field is also generated which decreases with increasing distance from the main magnet. These stray fields constitute a hazard to humans and to magnetic objects, meaning that there is a need to control the impact of the stray magnetic fields.

Safety procedures here are frequently based on what is known as the 5 Gauss line, in other words on the isosurface of the stray field at a field strength of 5 Gauss.

The term "line" is vague, since in reality it refers to a three-dimensional surface in the space. Consequently the text below shall refer to an iso-contour surface or an isosurface of a particular field strength, e.g. to the 5 Gauss iso-contour surface.

The geometry of the iso-contour surface of a particular field strength differs from one MR device to another, and therefore represents an individual property of a specific MR device which on the one hand depends on the main magnet and on the other on possible shielding. MR devices constructed in the same manner, however, also generate magnetic fields of the same shape.

In order to reduce the hazards ensuing from the stray field, a known technique is to shield the magnetic field generated by the main magnetic field with respect to the outside. This may take place through passive shielding, by magnetic materials being arranged outside of the main magnet. For example, the shield may also be integrated in room paneling of the room in which the MR device is set up. As a rule, however, the shielding is performed actively by means of a current-carrying, superconductive coil, which largely counterbalances the stray magnetic field.

A residual stray field remains despite shielding, however. While this decreases faster with increasing distance owing to the screening, safety-relevant field strengths are still frequently exceeded in the vicinity of the MR device. In particular, the 5 Gauss iso-contour surface is frequently located outside of the housing of the MR device, meaning that despite shielding, hazards still remain.

A known technique from the prior art is to apply markings in the form of tapes or similar to the floor at a distance from the MR device regarded as safe. However these are often unspecific and in addition may be accidentally crossed.

SUMMARY

Against this backdrop, the objective underlying the invention is to eliminate, or at least reduce, the hazards ensuing from the stray field generated by the main magnet of an MR device.

To meet this objective, one or more features described herein are provided. In particular it is thus suggested, in order to meet the stated objective in accordance with the invention, that in the case of an MR measuring assembly of the type named at the start the border should mark and/or approximate an iso-contour surface of the stray field at a specified magnetic field strength.

Alternatively, or additionally, it is provided in accordance with the invention that the border circumscribes an iso-contour surface of the stray field at a specified magnetic field strength.

Here the iso-contour surface will frequently not surround the whole three-dimensional, unbroken surface of the iso-contour surface, but only part of the whole surface. The marked and/or approximated and/or circumscribed part of the surface may here, in terms of area, largely correspond to the section covered by the border. It may therefore be provided, that the iso-contour surface is given by a partial area of a complete iso-contour surface of the stray field to the specified magnetic field strength, the partial area being located at the level of the platform. Preferably, the extension of the partial area corresponds to the height of the platform. The expansion of the partial area can also be negligibly small in vertical direction, so that the partial area shrinks to a line. In order to avoid conceptual confusion, a complete iso-contour surface is also called a complete isosurface in the context of this description of the invention.

Alternatively, it may be provided that the isocontour surface is determined by a vertical projection of a complete isosurface of the stray field to the specified magnetic field strength.

In order to illustrate this, one may say that a complete isosurface of the stray field at a given magnetic field strength forms a surface in space that regularly completely surrounds the MR device. If this surface is now projected perpendicularly onto the plane formed by the floor or formed by the surface of the platform, a two-dimensional surface with an outer edge results. The border of the platform should not lie within this outer edge of the surface. If necessary, a certain safety distance may be provided as described in more detail below.

It should be noted that the stray field typically has its maximum extension above the platform. An alignment of the platform with a projection of the iso-contour surface can therefore be advantageous compared to an alignment with the iso-contour surface at the height of the platform. In this way, it is possible to prevent that one enter critical magnetic field strengths when one approaches the platform.

In the case of the aforementioned technical solutions, the platform—owing to the fact that its border marks and/or approximates and/or circumscribes an iso-contour surface of a specified magnetic field—forms a natural barrier to objects and people that prevents accidental entry into areas where the stray magnetic fields are too strong. In addition, it can be achieved by means of the technical solution that the platform has a shape which on the one hand is large enough to prevent objects and people being accidentally exposed to high field strengths, and which on the other hand is also small enough to keep the required space, and the material and manufacturing costs, as low as possible.

If the specified magnetic field strength is sufficiently low and hence selected safely, then no further hazards can ensue from the stray field of the main magnet. In addition to protecting people, this also for example protects equipment that can be moved on the floor and is not MR-compatible, for example patient beds, drip stands, incubators or anesthesia devices. These cannot accidentally be moved too close to the magnet.

The person skilled in the art, in order to create an MR measuring assembly in accordance with the invention, can for example first measure or otherwise determine the stray field of an MR device for which a customized platform is to be created. He can specify a magnetic field strength, for example a field strength of 5 Gauss. From this, the person skilled in the art obtains an iso-contour surface of the specified field strength. Knowing where the contact faces of the MR device are located, the person skilled in the art can develop a platform in a manner according to the invention by specifying a lateral border for the platform which marks and/or approximates and/or circumscribes an iso-contour surface of the stray field at a specified magnetic field strength.

In one embodiment of the MR measuring assembly in accordance with the invention, it may be provided that the border of the platform forms a step. The step may be designed as a ledge. A ledge may be characterized in that it forms an elevation above the surface on which the platform stands. The step or ledge may be accessible. For example, it may be provided for it to be accessible through a person climbing onto the platform. This may occur in a similar way to a person climbing a stair. Such embodiments may have the advantage of the platform on the one hand being accessible in order for example to allow hospital staff, engineers or patients access to the MR device, but on the other hand there being an obstacle that prevents objects or people coming too near the MR device by mistake and being exposed to excessively high magnetic field strengths there.

It may be provided that the border runs only part of the way around the MR device. This may be sufficient if, for example, accessibility to a rear section of the MR device is prevented by means of other barriers.

Such barriers can however be dispensed with if the border runs all the way around the MR device. Such an embodiment may therefore be advantageous.

With one advantageous embodiment of the invention it may be provided that a field strength interval is specified whose upper limit defines the aforementioned iso-contour surface and whose lower limit defines a further iso-contour surface of the stray field, with the border running between the two iso-contour surfaces or, in the case of projected isocontour surfaces, between their outer edges. By this means, the iso-contour surface pertaining to the upper limit of the field strength interval in particular is marked and approximated by the border of the platform. Such embodiments have the advantage that the shape of the border is adapted well to the specified field strength interval, meaning that there is a high level of control over the hazard that people or objects entering the vicinity of the border are exposed to.

A particularly high level of control is achieved over the hazard potential if it is provided that the specified field strength interval covers a field strength range that is less than 20%, preferably less than 10%, particularly preferably less than 5%, of a median of the field strength interval. The border marks and approximates the iso-contour surface pertaining to the upper limit of the field strength interval even more precisely if the specified field strength interval covers a field strength range that is less than 2% or even less than 1% of a median of the field strength interval.

In order to obtain optimum control over the hazard potential, it may be provided that the border runs on the iso-contour surface at the specified magnetic field strength. If the iso-contour surface is provided by a projection, this means that the border runs on an outer edge of the iso-contour surface. In these cases, the magnetic field strength on the border is constant. However, this only applies within the scope of the usual tolerances for the manufacture of the platform and the placing of the MR device on the platform. Furthermore, a safety distance may additionally be provided. This may for example be a few centimeters. In this case, the border of the platform is therefore actually located a few centimeters outside of the iso-contour surface of the specified magnetic field strength. With these embodiments, too, the iso-contour surface is marked and approximated by the border of the platform at the specified magnetic field strength. An appropriate level of safety can also be achieved if, despite there being no safety distance provided from the iso-contour surface, the provided magnetic field strength is however selected to be somewhat lower than the permitted level. Such a safety distance makes it possible to balance out error margins when manufacturing the platform, when determining the stray magnetic field, or when placing the MR device on the platform.

In order to facilitate the manufacture of the platform it may be provided, with one advantageous embodiment of the platform, that the border lies on an envelope of an iso-contour surface of the stray field at the specified magnetic field strength. The envelope may for example be the convex hull of the iso-contour surface. With these embodiments, too, the iso-contour surface is marked and approximated by the border of the platform at the specified magnetic field strength.

A safety distance in relation to the envelope may be provided. For example, the safety distance may be a few centimeters. A safety distance may also be achieved by, despite the border lying directly on the envelope, a magnetic field strength being specified which is selected somewhat below the permitted magnetic field strength.

A hazard is prevented effectively if provision is made for the specified magnetic field strength to be five Gauss.

With one advantageous embodiment, provision may be made for the platform to have a marking indicating the spot on which to place the MR device. This marking ensures that when installing the MR measuring assembly, the MR device is placed such that reliable marking and/or approximation of the iso-contour surface occurs and the MR device is not accidentally shifted out of position when placed on the platform. The marking may for example be formed by a drawn boundary line, by a guide rail, by a snap connection, by a screw hole, by several such markings, by a combination of such markings or by any other desired type and number of markings.

With one advantageous embodiment of the platform, it may be provided that the platform is not magnetic. Preferably the platform is made from one or more non-magnetic materials. Such embodiments have the advantage that the stray field is not distorted and that eddy currents are avoided.

With a further advantageous embodiment of the platform, it may be provided that the platform is designed flat on the upper side. Over and above this, the platform is preferably designed level on the upper side. Alternatively, or additionally, it may be provided that the platform forms a slab with a sub-construction, wherein the sub-construction bears the weight of the MR device. Preferably the slab is made from wood, plastic or a non-magnetic stainless steel. Here the border is preferably formed from a lateral surface of the slab. The advantage of such embodiments is that they prevent accidental entry into an area of strong magnetic fields and uniform load distribution is enabled.

With a further advantageous embodiment of the platform, it may be provided that the border is defined by a cross section of a plane with the stray magnetic field on which it has the specified magnetic field strength. It is particularly advantageous if the plane is provided by the upper side of the aforementioned level slab.

The sub-construction may advantageously be made from a non-magnetic stainless steel.

In addition, the sub-construction may advantageously have non-magnetic girders made from stainless steel.

With a further advantageous embodiment of the platform, it may be provided that on or in the area of the border, a barrier extending upwards is constructed. Here, the barrier preferably extends to at least shoulder height. Particularly preferably, the barrier extends to at least head height. Shoulder height is defined as 1.5 m above the ground. Head height is defined as 2 m above the ground. It may be provided that the barrier has a recess for docking a patient bench. The recess may be designed to be closable. These kinds of embodiments with a barrier that extends upwards provide even more effective protection as they prevent the entry of protruding objects or body parts into an area of elevated magnetic field strength.

To meet the objective, in accordance with the invention, additionally the features directed towards the use of a step, are also provided. In particular it is hence also suggested in accordance with the invention, in order to meet the named object, that a step be used for marking and/or approximation of an iso-contour surface of a stray magnetic field of an MR device at a specified magnetic field strength. Here, the step may be designed as a ledge. This may be characterized as already previously described. Through such use of a step it can be ensured that people or objects are not accidentally exposed to elevated magnetic field strengths. The previous statements regarding the advantages of the MR measuring assembly designed in accordance with the invention apply accordingly.

Advantageously, it may be provided that the step is formed from a border of a platform on which the MR device is placed. Preferably, the platform and the MR device form an MR measuring assembly which is designed in accordance with the invention, in particular as described above and/or in accordance with one of the claims geared towards an MR measuring assembly. Such uses have advantages that correspond to the advantages already described above.

In order to meet the stated objective, in accordance with the invention, additionally the features directed towards a method are provided. In particular it is hence suggested in accordance with the invention, in order to meet the stated objective in a method of the type named at the start, that a magnetic field strength be specified, that an iso-contour surface of a stray field of a main magnet of an MR device be determined at the magnetic strength, that a plane for placing the MR device be specified and that in the plane a lateral border of the platform be specified which marks and/or approximates and/or circumscribes the iso-contour surface of the stray field at the specified magnetic field strength.

Then, in accordance with the invention, a platform can be produced by initially, using the previously named method, the border of the platform being determined and then by a platform with such a border being produced. Here the person skilled in the art can use the usual manufacturing techniques and materials, in particular as described above.

In addition, the invention relates to a platform, produced using the method described above for manufacturing a platform, and hence, in particular by means of the method described above, for determining a border of a platform.

Accordingly, an MR measuring assembly can also be produced.

Here the platform and/or the MR measuring assembly are preferably designed in a manner as described above. In particular, the MR measuring assembly is preferably designed in accordance with one of the claims geared towards a measuring assembly.

BRIEF DESCRIPTION OF THE DRAWINGS

The invention shall now be described in more detail using one or a few exemplary embodiments, but is not limited to these few exemplary embodiments. Additional exemplary embodiments and variations of the invention are generated by combining the features of single or multiple claims with each other and/or with single or multiple features of the exemplary embodiments or of the previously described variations of the invention.

The following are shown by the figures.

DETAILED DESCRIPTION

Figure 1:
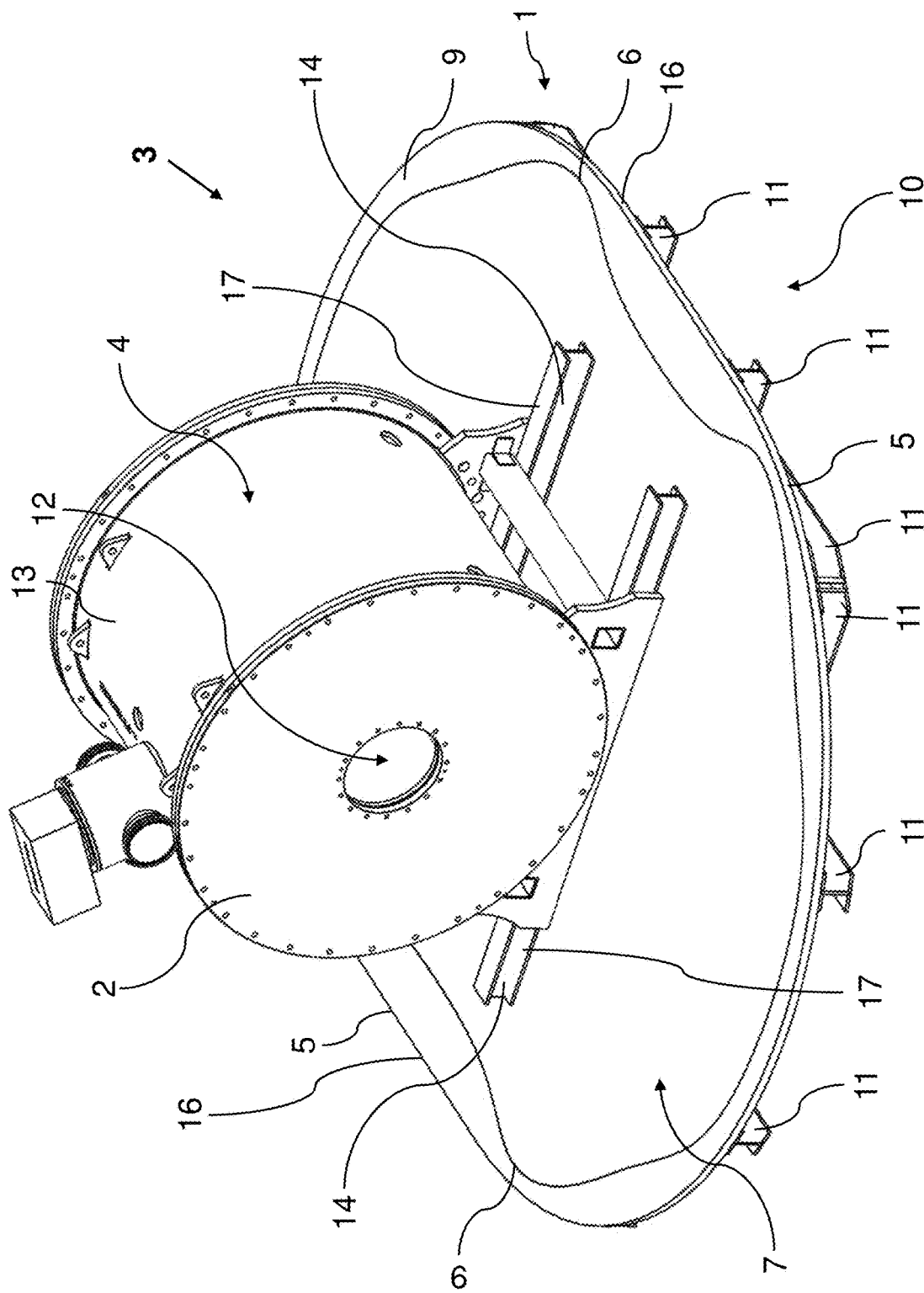
FIG. 1 an exemplary embodiment of an inventive MR measuring assembly in perspective view, FIG. 2 The MR measuring assembly from FIG. 1 viewed from above, FIG. 3 Schematic representation of the MR measuring assembly from FIG. 1 in perspective view with a drawn iso-contour surface.
Figure 2:
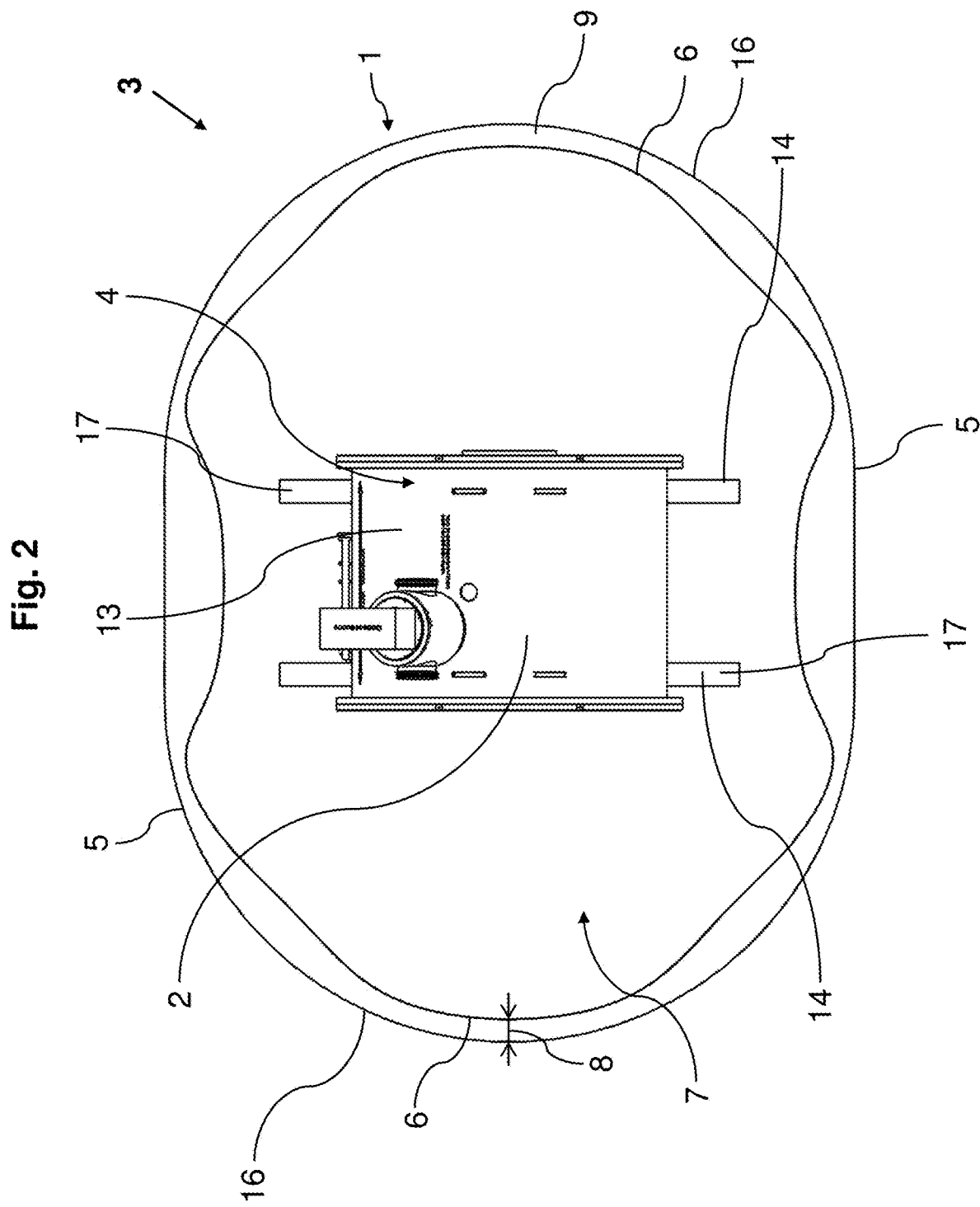
Figure 3:
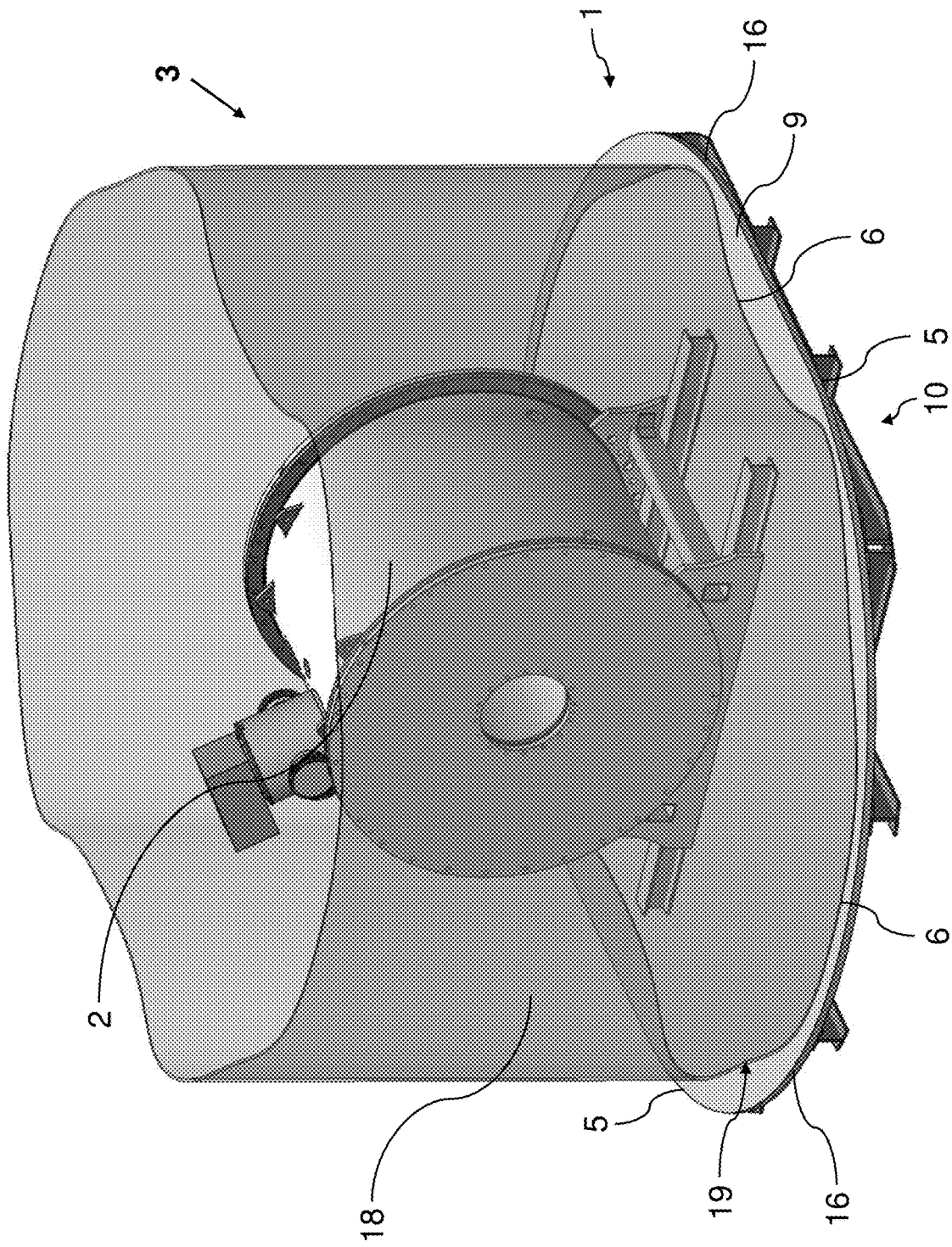

FIG. 1 to FIG. 3 show views of an exemplary embodiment of an inventive MR measuring assembly 3. The MR measuring assembly 3 comprises an MR device 2, which is placed on a platform 1 designed in accordance with the invention.

Platform 1 has a slab 9 and a sub-construction 10. In the exemplary embodiment described here, the slab 9 is made from wood. However, it can be made from any other desired non-magnetic material. In the exemplary embodiment described here, the sub-construction 10 has a plurality of non-magnetic girders 11 made from stainless steel. The girders 11 take the weight of the MR device 2 and transfer it to the ground on which the platform 1 stands.

Resting on the slab 9 are load carriers 14, which take the weight of the MR device and transfer it, through the slab 9, to the sub-construction 10. In order to avoid a load being placed on the slab 9, girders 11 may be arranged beneath the load carriers 14 and the slab 9.

The load carriers 14 form a marking 17 which specifies the spot for placing the MR device 2. At right angles to the load carriers 14, the placing is clearly specified. Along the length of the load carriers 14, displacement of the MR device 2 is possible. It is therefore advantageous if it is provided that there, too, a marking is provided which permits reliable alignment of the MR device 2 on the load carriers 14. For example, the marking 17 may consist of a snap connection or be provided through the drawing of a boundary line on the load carriers 14.

On its outer side, the slab 9 has a border 5 which in the present exemplary embodiment completely surrounds the MR device 2. The border 5 forms an unbroken strip with a height that corresponds to the thickness of the slab 9.

The MR device 2 has a main magnet 4. The main magnet 4 surrounds a tube 12. If an MR measurement is performed, then beforehand the object to be examined is pushed into the tube 12.

The main magnet 4 generates a magnetic field. This is as homogeneous as possible in the tube 12 and is required in order to align nuclear spins of an object being examined or a person being measured.

The main magnet 4 is, in the exemplary embodiment described, actively shielded towards the outside. However, through the main magnet 4—also outside of the shielding and outside of the MR device 2—a magnetic field is generated in the form of an unwanted and potentially dangerous stray field.

The stray magnetic field decreases outside of the MR device 2 with increasing distance from MR device 2. It forms three-dimensional iso-contour surfaces 18, wherein an iso-contour surface 18 at a lower magnetic field strength surrounds an iso-contour surface 18 at a larger magnetic field strength.

In one plane an iso-contour surface 18 forms an unbroken line 6. In FIG. 1 and FIG. 2 the slab 9 forms a level surface which lies in the plane 7. The closed line 6, which is shown in FIG. 1 and FIG. 2, corresponds to a cross section of the plane 7 with the iso-contour surface 18 at the magnetic field strength 5 Gauss. It may also be said that the line 6 forms a 5 Gauss line. This is characterized in that on this [line], the magnetic field strength generated by the main magnet 4 is 5 Gauss. Outside of the 5 Gauss line, the magnetic field strength is smaller than 5 Gauss, whilst inside of the 5 Gauss line it is higher than 5 Gauss.

The border 5 of the slab 9 and hence of the platform 1 is selected so that it marks and approximates the subarea 19 of the iso-contour surface 18 at magnetic field strength 5 Gauss. Here the border 5 lies a few centimeters outside the iso-contour surface 19 at magnetic field strength 5 Gauss and therefore a few centimeters outside the 5 Gauss line. Depending on safety requirements, a magnetic field strength other than 5 Gauss could also be specified.

The iso-contour surface 18 is only represented schematically. A real iso-contour surface 18 has a complex geometry and curves back above the MR device 2. A complete surface of an isosurface 18 forms a closed surface.

The border 5, in the exemplary embodiment according to FIGS. 1 to 3, marks and approximates not the entire schematically sketched iso-contour surface 18 but only a narrow partial surface 19, whose height essentially corresponds to the height of the side of the slab 9.

Alternatively, the shown isocontour surface 18 can also form an outer boundary of a vertical projection of a real isocontour surface 18. In this case it is ensured that the stray field has a value below 5 Gauss at all spatial locations outside the boundary. All figures also cover this alternative, where the isocontour surface 6, 18 is formed by a vertical projection.

On the border 5, a barrier also extending upwards could be provided. This would likewise lie outside the 5 Gauss iso-contour surface 18.

The border 5 could follow the 5 Gauss line identically. However, this would result in an irregular border 5 with a complicated shape, which would lead to increased requirements regarding the manufacturing accuracy of the slab 9.

The border 5 is therefore, in the present exemplary embodiment, formed by an envelope 16 of the border 5, wherein additionally a safety distance 8 of a few centimeters is maintained. This safety distance 8 means that a field strength of 5 Gauss cannot be exceeded even if for example the MR device 2 is placed on the platform 1 in a slightly displaced manner. A safety distance 8 could also be achieved if, instead of a shaping of the border 5 on the 5 Gauss line, a shaping on a line which has a magnetic field strength lying somewhat below 5 Gauss takes place.

In summary, the invention relates to an MR measuring assembly 3 with an MR device 2 which has a main magnet 4 generating a stray magnetic field and a platform 1, having a lateral border 5, on which the MR device 2 is placed. The invention is characterized in that the border 5 marks and/or approximates an iso-contour surface 6, 18, 19 of the magnetic field at a specified magnetic field strength. The platform 1 therefore forms a natural barrier which prevents people or objects from being exposed to magnetic fields that are too high. To this end, the invention additionally provides for a step 15—for marking and/or approximation of an iso-contour surface 6, 18, 19 of a stray magnetic field of an MR device 2 at a specified magnetic field strength—to be used.

LIST OF REFERENCE SYMBOLS

1 Platform
2 MR device
3 MR measuring assembly
4 Main magnet
5 Border
6 5 Gauss line
7 Plane
8 Safety distance
9 Slab
10 Sub-construction
11 Girders of 10
12 Tube
13 Housing
14 Load carriers
15 Step
16 Envelope
17 Marking
18 An iso-contour surface
19 Subarea of 18

The invention claimed is:

1. A magnetic resonance (MR) measuring assembly (3), comprising:
   an MR device (2), which has a main magnet (4) that is adapted to generate a stray magnetic field;
   a platform (1), having a lateral border (5), on which the MR device (2) is placed;
   the border (5) at least one of marks, approximates, or circumscribes an iso-contour surface (6, 18, 19) of the stray field at a specified magnetic field strength; and
   the platform (1) includes a marking (17) indicating a spot for placing the MR device (2).

2. The MR measuring assembly (3) in accordance with claim 1, wherein the iso-contour surface (6, 18, 19) is determined by a vertical projection (6, 18) of a complete isosurface (18) of the stray magnetic field to the specified magnetic field strength.

3. The MR measuring assembly (3) in accordance with claim 1, wherein the border (5) of the platform (1) comprises a step (15).

4. The MR measuring assembly (3) in accordance with claim 1, wherein the border (5) extends all the way around the MR device (2).

5. The MR measuring assembly (3) in accordance with claim 1, wherein the specified magnetic field strength is five Gauss.

6. The MR measuring assembly (3) in accordance with claim 1, wherein the platform (1) is made from one or more non-magnetic materials such that the platform is non-magnetic.

7. The MR measuring assembly (3) in accordance claim 1, wherein the platform (1) is at least one of flat on an upper side thereof or comprises a slab (9) with a sub-construction (10), wherein the sub-construction (10) bears a weight of the MR device (2).

8. The MR measuring assembly (3) in accordance with claim 7, wherein the sub-construction (10) is at least one of made from a non-magnetic stainless steel or has non-magnetic girders (11) made from stainless steel.

9. A magnetic resonance (MR) measuring assembly (3), comprising:
   an MR device (2), which has a main magnet (4) that is adapted to generate a stray magnetic field;
   a platform (1), having a lateral border (5), on which the MR device (2) is placed;
   the border (5) at least one of marks, approximates, or circumscribes an iso-contour surface (6, 18, 19) of the stray field at a specified magnetic field strength;
   wherein a field strength interval is specified having an upper limit that defines the iso-contour surface (6, 18, 19) and having a lower limit that defines a further iso-contour surface (6, 18, 19) of the stray magnetic field, and the border (5) extends between the two iso-contour surfaces (6, 18, 19); and
   the specified field strength interval covers a field strength range which is less than 20% of a median of the field strength interval.

10. The MR measuring assembly (3) in accordance with claim 9, wherein the iso-contour surface (6, 18, 19) is determined by a vertical projection (6, 18) of a complete isosurface (18) of the stray magnetic field to the specified magnetic field strength the specified field strength interval covers a field strength range which is less than 20% of a median of the field strength interval.

11. A method for determining a border (5) of a platform (1) of a magnetic resonance (MR) measuring assembly, comprising:

specifying a magnetic field strength;
determining an iso-contour surface (6, 18, 19) of a stray magnetic field of a main magnet (4) of the MR device (2) at the specified magnetic field strength by a vertical projection (6, 18) of a complete isosurface (18) of the stray magnetic field to the specified magnetic field strength;
specifying a plane (7) for placing the MR device (2);
specifying a lateral border (5) of the platform (1) in the plane which at least one of marks, approximates, or circumscribes the iso-contour surface (6, 18, 19) of the stray magnetic field at the specified magnetic field strength; and
wherein either (a) the border (5) extends on the iso-contour surface (6, 18, 19) or on an outer edge of the iso-contour surface at the specified magnetic field strength plus an additional safety distance (8), or (b) the border (5) lies on an envelope (16) of an iso-contour surface (6, 18, 19) of the stray magnetic field at the specified magnetic field strength plus a safety distance (8) in relation to the envelope (16).

12. A platform (1) for placing a magnetic resonance device, the platform comprising a plane having lateral border (5) that is adapted to at least one of mark, approximate, or circumscribe an iso-contour surface (6, 18, 19) of a stray magnetic field at a specified magnetic field strength of the magnetic resonance device, wherein the iso-contour surface (6, 18, 19) is determined by a vertical projection (6, 18) of a complete isosurface (18) of the stray magnetic field to the specified magnetic field strength, and the platform (1) includes a marking (17) indicating a spot for placing the MR device (2).

13. A magnetic resonance (MR) measuring assembly (3), comprising:
   an MR device (2), which has a main magnet (4) that is adapted to generate a stray magnetic field;
   a platform (1), having a lateral border (5), on which the MR device (2) is placed;
   the border (5) at least one of marks, approximates, or circumscribes an iso-contour surface (6, 18, 19) of the stray field at a specified magnetic field strength; and
   either
   (a) the border (5) extends on the iso-contour surface (6, 18, 19) or on an outer edge of the iso-contour surface at the specified magnetic field strength plus an additional safety distance (8), or
   (b) the border (5) lies on an envelope (16) of an iso-contour surface (6, 18, 19) of the stray magnetic field at the specified magnetic field strength plus a safety distance (8) in relation to the envelope (16).

14. The MR measuring assembly (3) in accordance with claim 13, wherein the iso-contour surface (6, 18, 19) is determined by a vertical projection (6, 18) of a complete isosurface (18) of the stray magnetic field to the specified magnetic field strength.

15. The MR measuring assembly (3) in accordance with claim 13, wherein the border (5) of the platform (1) comprises a step (15).

16. The MR measuring assembly (3) in accordance with claim 13, wherein the border (5) extends all the way around the MR device (2).

17. The MR measuring assembly (3) in accordance with claim 13, wherein the specified magnetic field strength is five Gauss.

18. The MR measuring assembly (3) in accordance with claim 13, wherein the platform (1) is made from one or more non-magnetic materials such that the platform is non-magnetic.

19. The MR measuring assembly (3) in accordance claim 13, wherein the platform (1) is at least one of flat on an upper side thereof or comprises a slab (9) with a sub-construction (10), wherein the sub-construction (10) bears a weight of the MR device (2).

20. The MR measuring assembly (3) in accordance with claim 19, wherein the sub-construction (10) is at least one of made from a non-magnetic stainless steel or has non-magnetic girders (11) made from stainless steel.

* * * * *